(12) United States Patent
Posti

(10) Patent No.: US 6,810,027 B1
(45) Date of Patent: Oct. 26, 2004

(54) MULTI-CARRIER TRANSMITTING APPARATUS AND METHOD

(75) Inventor: Harri Posti, Oulu (FI)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 09/549,102

(22) Filed: Apr. 12, 2000

Related U.S. Application Data

(63) Continuation of application No. PCT/EP98/06064, filed on Sep. 23, 1998.

(51) Int. Cl.[7] .......................... G08C 17/00; H04B 7/14; H04L 25/03
(52) U.S. Cl. ...................... 370/311; 370/321; 375/296; 375/326; 455/17; 455/46
(58) Field of Search ................................ 370/311–344; 375/296, 326, 339, 297; 455/17, 45, 59, 119, 127, 522, 355

(56) References Cited

U.S. PATENT DOCUMENTS

| 4,003,003 A | | 1/1977 | Heaberlin |
| 5,329,260 A | | 7/1994 | Poplin |
| 5,710,981 A | * | 1/1998 | Kim et al. |
| 6,108,385 A | * | 8/2000 | Worley, III |

FOREIGN PATENT DOCUMENTS

| DE | 198 32 116 A1 | * | 7/1998 | ........... H04L/27/01 |
| EP | 0 973 306 A2 | | 1/2000 | |
| GB | 2 215 152 | | 9/1989 | |
| WO | WO 96/15584 | | 5/1996 | |
| WO | WO 00/01084 | | 1/2000 | |

OTHER PUBLICATIONS

Ives, F.H.; "Multifunction synthesizer For Building Complex Waveforms", Hewlett–Packard Journal, vol. 40, No. 1, Feb. 1, 1989, p. 52–57.

Talbot, M.D., "Digital Waveform Synthesis IC Architecture", Hewlett–Packard Journal, vol. 40, No. 1, Feb. 1, 1989, p. 57–62.

* cited by examiner

*Primary Examiner*—Afsar Qureshi
(74) *Attorney, Agent, or Firm*—Squire, Sanders & Dempsey L.L.P.

(57) ABSTRACT

A multi-carrier transmitting apparatus and method is described, wherein a plurality of carrier signals are combined in the digital domain and supplied to a D/A converting means (3) for converting the combined digital carrier signals into an analog signal to be transmitted. The frequency characteristic of the D/A converting means (3) is compensated by scaling means (51 to 54) for pre-scaling individual ones of said plurality of carrier signals before being combined and supplied to D/A converting means (3). The pre-scaling may be performed by multiplying digital data, representing the carrier signals, by corresponding frequency-dependent digital scaling words. Thereby, the need for signal processing intensive digital filters or non-ideal analog filters can be prevented. In case a digital power control is provided, the scaling word can be combined with a power control word.

8 Claims, 4 Drawing Sheets sinc(x) function

Before DAC

After DAC

MULTI-CARRIER TRANSMITTING APPARATUS AND METHOD

This application is a continuation of international application serial number PCT/EP98/06064, filed Sep. 23, 1998.

FIELD OF THE INVENTION

The present invention relates to a multi-carrier transmitting apparatus and method for a radio network, wherein a plurality of carrier signals are combined in the digital domain.

BACKGROUND OF THE INVENTION

In recent years, increased research and development has taken place in the field of multi-carrier wideband applications for FDMA, TDMA or CDMA systems. Such multi-carrier applications provide potential cost and size benefits.

FIG. 3 shows a known multi-carrier transmitter, wherein signal combining of multiple carriers is performed in the digital domain before a subsequent D/A-conversion.

In FIG. 3, reference numerals 11 to 14 indicate base band processing means for processing digital base band signals to be transmitted on different carrier frequencies. Therein, different input signals are placed on different carrier frequencies by a bank of parallel DDSs (Direct Digital Synthesizers) 21 to 24 as a means for digitally generating carrier signals which can be modulated easily. Alternatively, a Fast Fourier Transformation (FFT) could be performed on the input signals. If the DDSs 21 to 24 are used, modulation can be combined in the digital frequency synthesis. In case of FFT, the modulation is performed prior to frequency transformation.

Subsequently, parallel words output from the DDSs 21 to 24 and representing the modulated digital signals are combined by a digital addition and supplied to a D/A converting means 3. In case of the FFT process a single bit stream is generated, such that an addition is not required.

The D/A converting means 3 performs a D/A-conversion of the digital combined multi-carrier signal so as to generate an analog multi-carrier signal which is supplied to a transmitting means 4. In the transmitting means 4, the analog multi-carrier signal received from the D/A converting means 3 is frequency-converted to the final transmission frequency in order to be transmitted via corresponding radio channels.

However, the output amplitude response of the D/A converting means 3 exhibits a sinc(x) characteristic as shown in FIG. 4. Such a sinc(x) characteristic is defined by the following equation:

$$A(f_0) = \sin(\pi f_0/f_c)/(\pi f_0/f_c),$$

wherein $f_0$ denotes an output frequency and $f_c$ a clock frequency of the D/A converting means 3.

In the above case of the multi-carrier transmitter, the multiple carrier signals are combined in the digital domain before the D/A-conversion and are located at different frequencies. Thus, the output amplitudes of different carriers will be weighted by the above output amplitude response or transfer function of the D/A converting means 3.

FIG. 5a shows a frequency spectrum of the digital multi-carrier signal before the D/A-conversion. In the shown case, the combined four carrier signals have the same absolute value |A| of the amplitude.

If a digital multi-carrier signal having such a frequency spectrum is input into the D/A converting means 3, a D/A converted output signal is obtained having a frequency spectrum as shown in FIG. 5b. According to FIG. 5b, the absolute values |A| of the amplitudes of the individual carrier signals have been weighted by the transfer function of the D/A converting means 3, wherein the absolute value |A| decreases with increased carrier frequencies.

According to a known solution to the weighting problem of the D/A converting means 3, an analog filter having a 1/sinc(x) frequency response is provided after the D/A converting means 3. Such a 1/sinc(x) frequency response is shown in FIG. 6.

Thus, the analog filter serves to compensate for the weighting performed by the D/A converting means 3.

However, such an analog filter exhibits non-idealities and thus degrades the signal as well as adds to the amount of analog hardware.

According to another known solution, a digital filter with a 1/sinc(x) frequency response is inserted after combining the individual carriers, but before the D/A converting means 3. FIG. 7 shows the frequency response of such a digital filter.

Digital filtering or pre-emphasis provides higher performance than the analog filter, but at the cost of increased signal processing. Furthermore, the processing has to take place at a high date rate, which is typically equal to the clock rate of the D/A conversion.

SUMMARY OF THE INVENTION

It is an object of the present invention to provide a multi-carrier transmitting apparatus and method, by means of which the described amplitude distortion of the multiple carrier signal can be compensated in a simple manner.

This object is achieved by a multi-carrier transmitting apparatus comprising: scaling means for pre-scaling individual ones of a plurality of carrier signals; combining means for combining said plurality of carrier signals in the digital domain; and D/A converting means for converting the combined digital carrier signals into an analog signal to be transmitted, wherein a scaling factor of said scaling means is selected so as to compensate for a frequency characteristic of said D/A converting means.

Furthermore, this object is achieved by a multi-carrier transmission method comprising the steps of: pre-scaling individual ones of a plurality of carrier signals; combining said plurality of carrier signals in the digital domain; and D/A converting the combined carrier signals into an analog signal to be transmitted, wherein a scaling factor used in the pre-scaling step is selected so as to compensate for a frequency characteristic of the D/A-conversion step.

Accordingly, the inconvenient digital or analog filter can be replaced by a simple scaling of each individual carrier. This takes place before combining the carriers. Thereby, a signal processing intensive digital filter or a non-ideal analog filter is not required.

Moreover, the pre-scaling can be done at a low data rate, which typically equals the symbol rate, before data interpolation. For example, in a GSM system with a multicarrier signal having a bandwidth of 10 MHz, the clock rate must be larger than 20 MHz, preferably larger than 30 MHz, whereas the symbol rate is only 271 kHz.

Preferably, the scaling is performed by multiplying the digital carrier data by the scaling factor. Therein, a plurality of frequency-dependent scaling factors can be stored in a storing means of a control means used for controlling the transmitting apparatus. The control means may select and supply the scaling factor to the scaling means. Preferably, the storing means may comprise a look-up table including the plurality of frequency-dependent scaling factors.

In case a digital power control is provided, the power control words may also be used for performing the pre-scaling. In such a case, the control means may comprise a power control means for supplying power control words to be used for controlling the power of the plurality of carrier signals, and a scaling control means for supplying frequency-dependent scaling control words to the scaling means, wherein the control means is arranged to multiply each of the plurality of power control words with the corresponding one of the plurality of scaling control words and to supply the results to the scaling means.

Thereby, the hardware requirements are minimized, since the power control means can be extended so as to perform pre-scaling as well.

Further preferred developments of the present invention are defined in the dependent claims.

BRIEF DESCRIPTION OF THE DRAWINGS

In the following, the invention will be described in greater detail on the basis of a preferred embodiment with reference to the accompanying drawings, wherein.

DESCRIPTION OF THE PREFERRED EMBODIMENT

Figure 1:
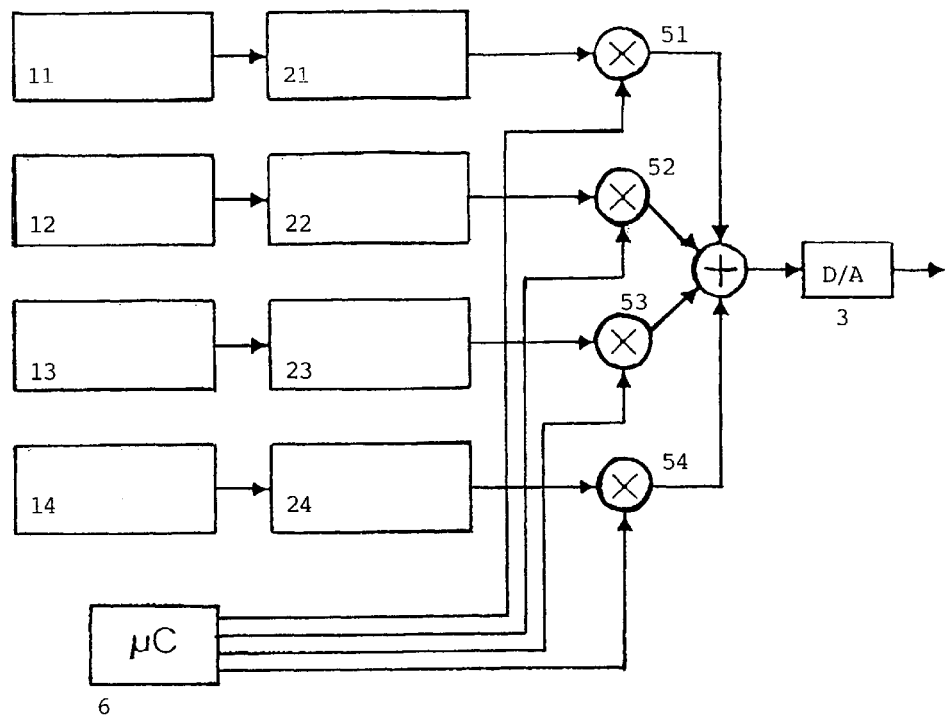
FIG. 1 shows a block diagram of a multi-carrier transmitting apparatus according to the preferred embodiment of the present invention.
Figure 3:
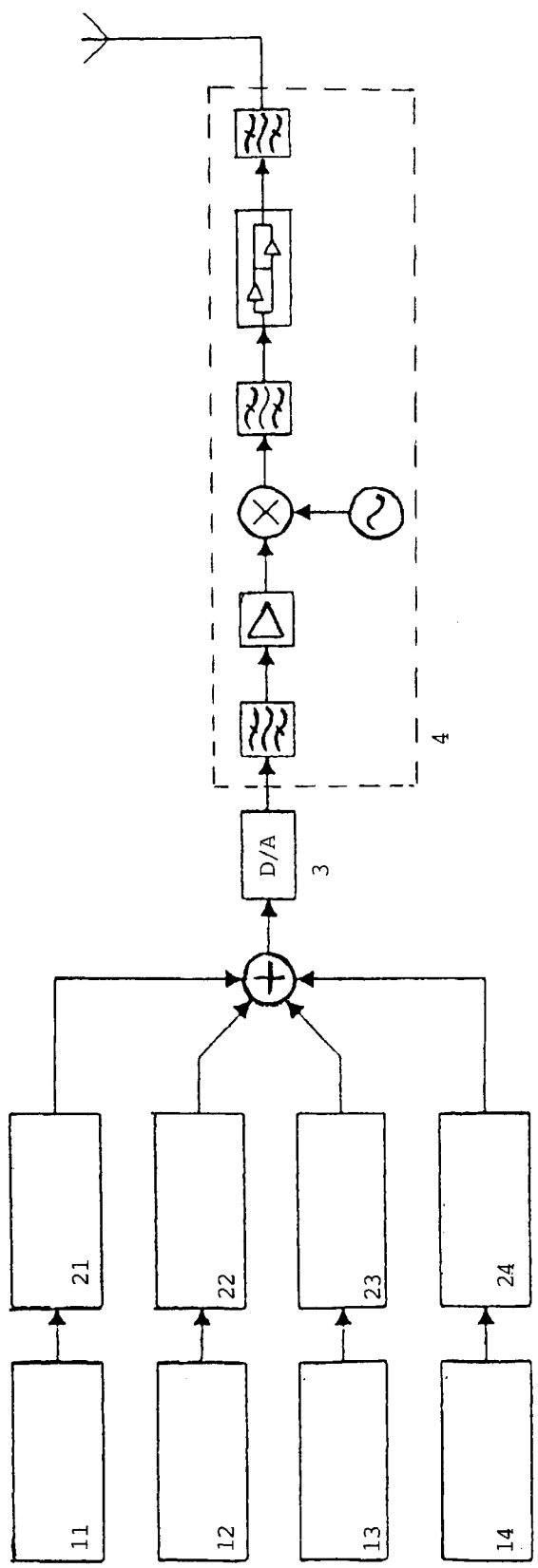
FIG. 3 shows a block diagram of a multi-carrier transmitting apparatus according to the prior art.
Figure 4:
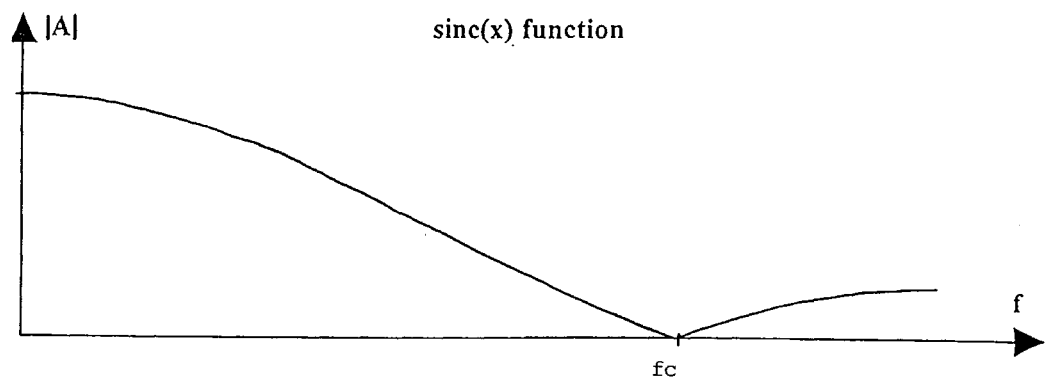
FIG. 4 shows a frequency characteristic of a D/A converting means.
Figure 5A:
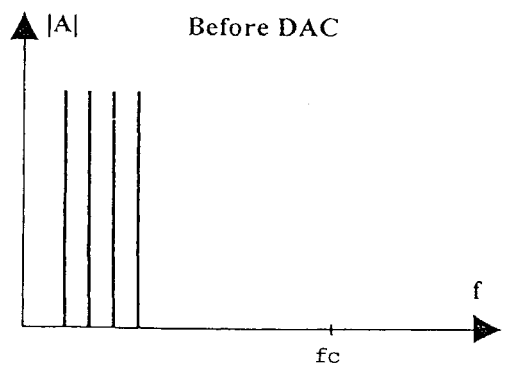
FIG. 5a shows a frequency spectrum of a multi-carrier signal before D/A-conversion.
Figure 5B:
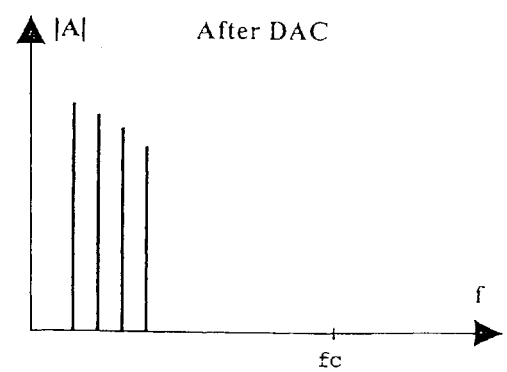
FIG. 5b shows a frequency spectrum of a multi-carrier signal after/D/A-conversion.
Figure 6:
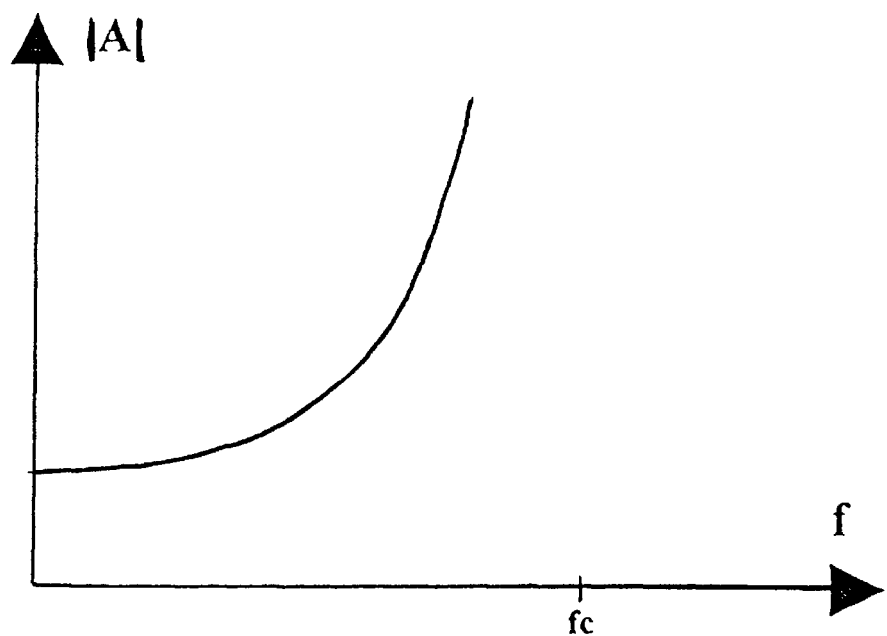
FIG. 6 shows a frequency characteristic of an analog or digital filter used for compensating the frequency characteristic of the D/A converting means.
Figure 7:
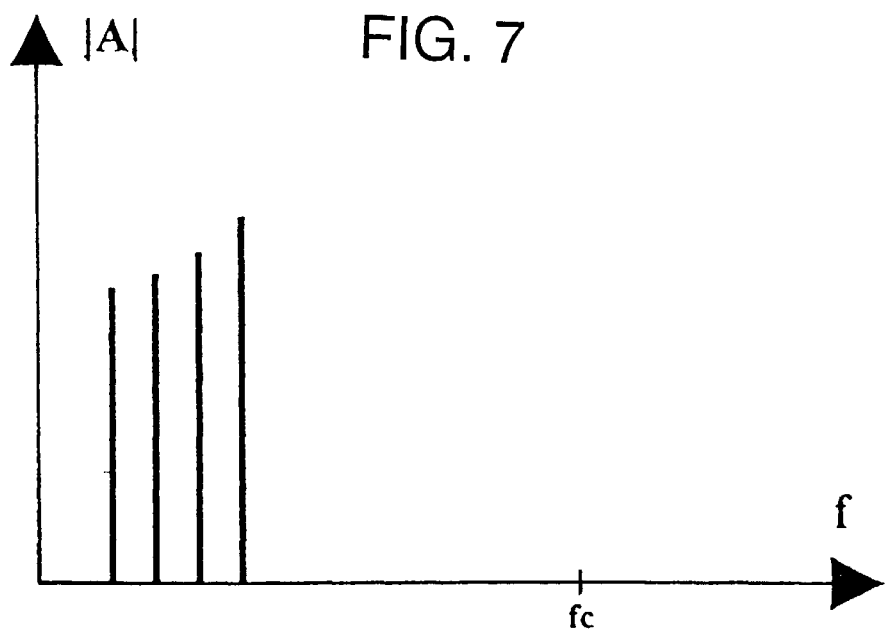
FIG. 7 shows a frequency spectrum of a pre-emphasized multi-carrier signal.

A block diagram of a preferred embodiment of the present invention is shown in FIG. 1, wherein the transmitting means 4 is not shown and wherein the same components as those shown in FIG. 3 are denoted by the same reference numerals. In FIG. 1, additional multiplying means 51 to 54 are provided for multiplying the individual digital carrier data obtained from the modulation and DDS means 21 to 24 by a scaling word supplied from a microcontroller 6 or another suitable control means. The supplied scaling words are selected by the microcontroller 6 in dependence on the carrier frequency of the corresponding carrier data to be multiplied.

The scaling words are selected in accordance with a frequency function which is preferably an inversion of the frequency characteristic of the D/A converting means 3, so as to compensate for the weighting performed by the D/A converting means 3. However, any other frequency dependency can be selected as long as an adequate compensation can be achieved.

The scaling words can be stored in a memory of the microcontroller 6, such as a look-up table or the like. In case of a GSM system with a bandwidth of 10 MHz and 50 possible carrier frequencies spaced apart by 200 kHz, 50 scaling words would be required. Assuming a word length of 16 bit for the digital data and the scaling factors, the memory capacity required for the look-up table equals to:

$$50 \times 16/8 = 100 \text{ Byte.}$$

Accordingly, the individual digital carrier data which are output from the modulation and DDS means 21 to 24 are multiplied by individual scaling words supplied from the microcontroller 6, such that the weighting function due to the frequency characteristic of the D/A converting means 3 is compensated and the total frequency response of the multiplying means 51 to 54 in combination with the D/A converting means 3 exhibits a frequency characteristic having approximately a fixed value in the frequency range of interest.

Figure 2:
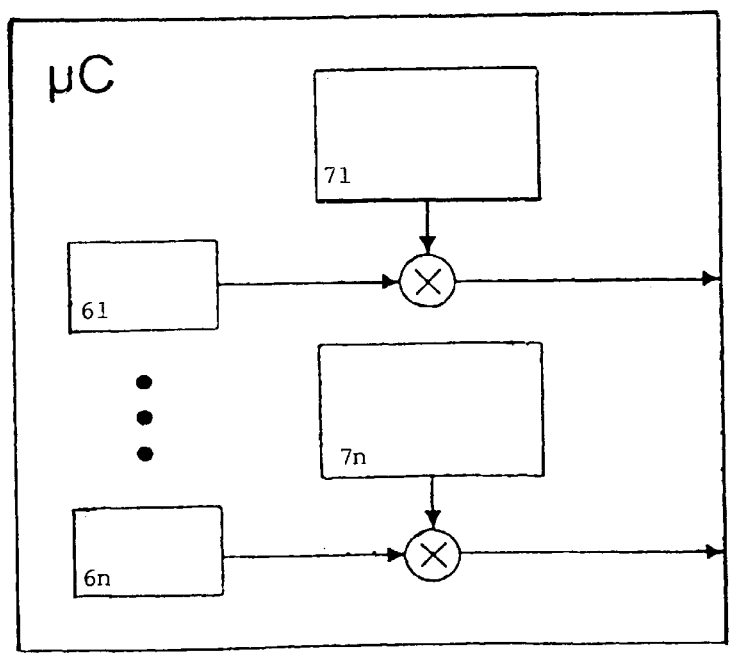
FIG. 2 shows a block diagram of a control means used in the preferred embodiment of the present invention.

In case a digital power control function is implemented in the multi-carrier transmitting apparatus, a control means used for the power control can be adapted to perform pre-scaling as well. FIG. 2 shows a block diagram of the microcontroller 6 which is also used for the digital power control. According to FIG. 2, the microcontroller 6 comprises power control means 61 to 6n used for generating a digital power control word to be supplied to the corresponding individual carrier data channel. The power control words are multiplied with the corresponding carrier data so as to adjust the power of the resulting carrier signal to the transmission characteristic of the corresponding radio channel.

Such a digital power control system can easily be adapted to perform a pre-scaling so as to compensate for the frequency characteristic of the D/A converting means 3. In this case, the microcontroller 6 may comprise frequency-dependent scaling means 71 to 7n for generating frequency-dependent digital scaling words to be multiplied with the power control word of the corresponding carrier signal. Thus, the microcontroller 6 supplies individual combination data obtained by multiplying the power control words by the frequency-dependent scaling words. Accordingly, the power control words are scaled, so as to compensate for the frequency characteristic of the D/A converting means 3.

The scaling words supplied by the frequency-dependent scaling means 71 to 7n as well as the power control words supplied by the power control means 61 to 6n can be obtained by reading corresponding look-up tables provided in the microcontroller 6. Moreover, the frequency-dependent scaling means 71 to 7n and the power control means 61 to 6n not necessarily have to be provided as hardware means, but may also be realized by corresponding control programs stored in a memory of the microcomputer 6.

The power control and scaling words do not have to be individually looked up and subsequently multiplied. Alternatively, combination data may be contained in a single look-up table indexed by power level and frequency.

In case of a control word length of 16 bit at 9 power levels and 50 frequencies, the following memory capacities are required for the control words:

i) single look-up table with combined control words (i.e. 9×50 words):

$$9 \times 50 \times 16/8 = 900 \text{ Bytes}$$

ii) two separate look-up tables (i.e. 9+50 words):

$$(9+50) \times 16/8 = 118 \text{ Bytes}$$

It should be understood that the above description and the accompanying drawings are only intended to illustrate the present invention. Thus, the apparatus and method according to the invention may vary within the scope of the attached claims.

A multi-carrier transmitting apparatus and method is described, wherein a plurality of carrier signals are combined in the digital domain and supplied to a D/A converting means for converting the combined digital carrier signals into an analog signal to be transmitted. The frequency characteristic of the D/A converting means is compensated by scaling means for pre-scaling individual ones of said plurality of carrier signals before being combined and supplied to D/A converting means. The pre-scaling may be performed by multiplying digital data, representing the carrier signals, by corresponding frequency-dependent digital scaling words. Thereby, the need for signal processing intensive digital filters or non-ideal analog filters can be prevented. In case a digital power control is provided, the scaling word can be combined with a power control word.

What is claimed is:

1. A multi-carrier transmitting apparatus comprising:
   a) scaling means for individually pre-scaling the amplitudes of a plurality of modulated digital carriers according to their respective carrier frequencies;
   b) combining means for combining the outputs of said scaling means in the digital domain;
   c) D/A converting means for converting the combined digital signals into an analog signal to be transmitted; and
   d) a control means for selecting a plurality of scaling factors and supplying them to said scaling means,
   e) wherein said scaling means is adapted so that the used plurality of scaling factors compensate for a frequency characteristic of said D/A converting means, wherein
   f) said control means comprises power control means for supplying power control words to be used for controlling the power of said plurality of carrier signals, and scaling control means for supplying scaling control words which are calculated in dependence of the carrier frequencies of said modulated digital carriers by way of a frequency function and are supplied to said scaling means, wherein the control means is arranged to multiply each of said power control words with the corresponding one of said scaling control words, thereby forming respective scaling factors, and to supply the results to the scaling means.

2. An apparatus according to claim 1, wherein said scaling means comprises multiplying means for multiplying each signal out of said plurality of modulated digital carriers, by the corresponding one of said plurality of scaling factors.

3. Apparatus according to claim 1, wherein said control means comprises storing means for storing the plurality of scaling factors.

4. Apparatus according to claim 3, wherein said storing means comprises a look-up table for storing said plurality of scaling factors.

5. Apparatus according to claim 4, wherein said look-up table is indexed by a power level and a frequency.

6. Multi-carrier transmission method comprising the steps of:
   a) individual pre-scaling the amplitudes of a plurality of modulated digital carriers according to their respective carrier frequencies;
   b) combining the outputs of said pre-scaling step in the digital domain; and
   c) D/A converting the combined digital carrier signals into an analog signal to be transmitted, wherein
   d) a plurality of scaling factors used in said pre-scaling step is selected so as to compensate for a frequency characteristic of the D/A-conversion step, and
   e) said pre-scaling step is performed by multiplying each of said plurality of modulated digital carriers by a respective one out of said plurality of scaling factors, wherein
   f) each of said plurality of scaling factors is a combination of a power control word and a scaling control word which is calculated in dependence of the carrier frequency of the corresponding modulated digital carrier by way of a frequency function.

7. A method according to claim 6, wherein each of said plurality of scaling factors is obtained by multiplying said scaling control word by said power control word.

8. A method according to claim 6, wherein each of said plurality of scaling factors is stored in a look-up table.

* * * * *